(12) United States Patent
Hall

(10) Patent No.: US 7,253,086 B2
(45) Date of Patent: Aug. 7, 2007

(54) RECESSED DRAIN EXTENSIONS IN TRANSISTOR DEVICE

(75) Inventor: Lindsey Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 291 days.

(21) Appl. No.: 10/967,766

(22) Filed: Oct. 18, 2004

(65) Prior Publication Data

US 2006/0081894 A1    Apr. 20, 2006

(51) Int. Cl.
*H01L 21/3205*    (2006.01)
*H01L 21/4763*    (2006.01)

(52) U.S. Cl. ............................. 438/595; 257/E51.005; 257/E51.006; 438/482; 438/485

(58) Field of Classification Search ................ 438/482, 438/488, 595; 257/E51.005, E51.006
See application file for complete search history.

(56) References Cited

U.S. PATENT DOCUMENTS

| | | | |
|---|---|---|---|
| 6,214,679 B1* | 4/2001 | Murthy et al. .............. 438/299 |
| 6,214,736 B1 | 4/2001 | Rotondaro et al. | |
| 6,316,320 B1* | 11/2001 | Nakahata et al. ........... 438/300 |
| 6,645,835 B1* | 11/2003 | Yamoto et al. ............. 438/503 |
| 6,878,592 B1* | 4/2005 | Besser et al. ............... 438/285 |
| 6,949,482 B2* | 9/2005 | Murthy et al. .............. 438/739 |

* cited by examiner

*Primary Examiner*—Michelle Estrada
(74) *Attorney, Agent, or Firm*—Peter K. McLarty; W. James Brady, III; Frederick J. Telecky, Jr.

(57) ABSTRACT

A method of forming an integrated circuit transistor (50). The method provides a first semiconductor region (52) and forms (110) a gate structure ($54_x$) in a fixed position relative to the first semiconductor region. The gate structure has a first sidewall and a second sidewall ($59_x$). The method also forms at least a first layer ($58_x$, $60_x$) adjacent the first sidewall and the second sidewall. The method also forms (120) at least one recess ($62_x$) in the first semiconductor region and extending laterally outward from the gate structure. Additional steps in the method are first, oxidizing (130) the at least one recess such that an oxidized material is formed therein, second, stripping (140) at least a portion of the oxidized material, and third, forming (160) a second semiconductor region ($66_x$) in the at least one recess.

25 Claims, 3 Drawing Sheets

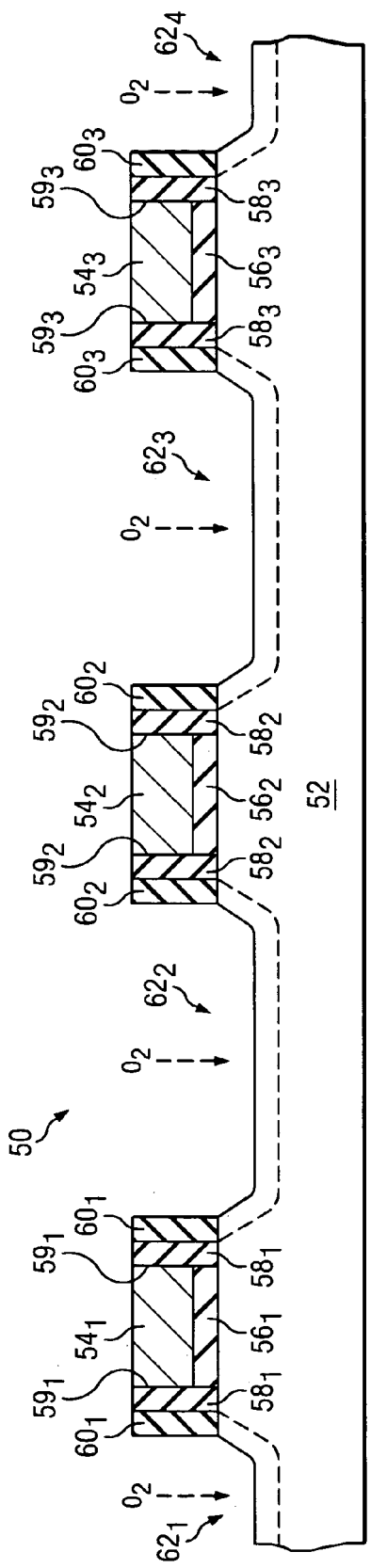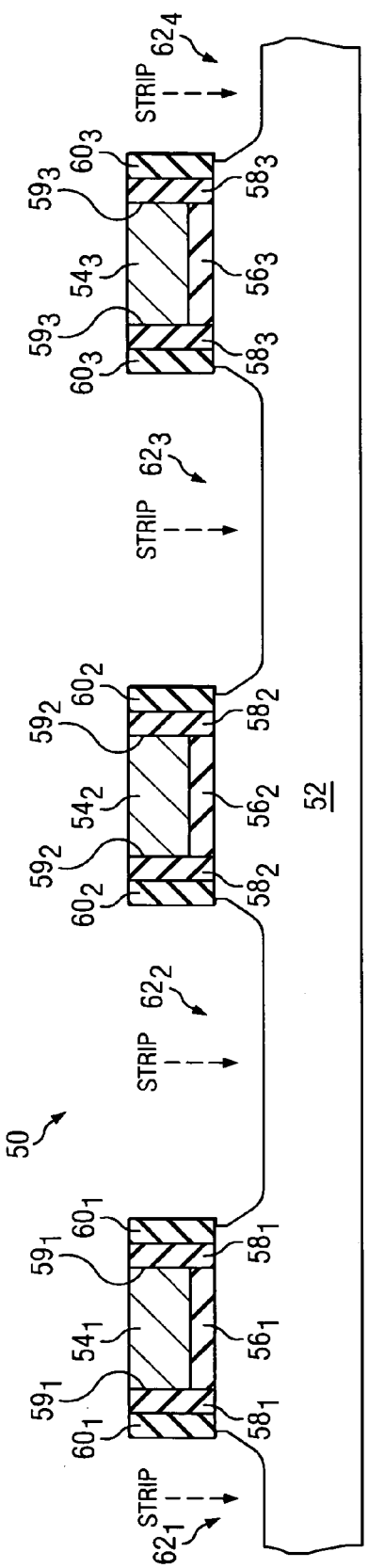

RECESSED DRAIN EXTENSIONS IN TRANSISTOR DEVICE

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuit manufacture and are more particularly directed to improving recessed drain extensions in a transistor device.

Semiconductor devices are prevalent in all aspects of electronic circuits, and an often critical and dominant element used in such circuits is the transistor. Thus, due to the evolution of electronic design and its criteria, considerable effort has been made to improve transistor design. One approach currently being implemented involves creating so-called silicon strain in the transistor channel through the use of recessed silicon-germanium (SiGe) drain extensions. Generally, various steps occur in this context. First, a transistor gate stack is formed in a fixed relationship relative to a semiconductor substrate. Next, a portion or all of the gate sidewall is built. When only a portion of the sidewall is built, that portion is sometimes referred to as a spacer and typically includes one or more layers formed on the vertical side surfaces of the transistor gate. Next, an etch is performed into the silicon substrate, thereby forming a "recess" laterally extending outward from both sides of the transistor gate and its sidewall or sidewall spacer. The recess is thereafter filled with an epitaxial deposition of SiGe, with the resulting SiGe regions being the "drain extensions." Due to the differing nature of the SiGe as compared to the silicon substrate beneath it, a mis-match is created in the lattice between these two different semiconductor materials, where the SiGe lattice is larger than that of the underlying silicon. The resulting lattice mis-match creates forms a "strain" in the transistor channel, which is located beneath the transistor gate stack. This strain has been found to enhance mobility in the transistor channel, thereby improving device performance.

While the preceding approach to recessed SiGe drain extensions has improved upon other transistor technologies, the present inventor has observed certain drawbacks with respect to this approach. Specifically, in order to perform the epitaxial deposition of SiGe in the device recesses as discussed above, a high-quality surface at the location of the recess is desirable. However, it has been observed that the imperfections of, and at, the silicon surface of the recess may compromise the quality of the epitaxial SiGe deposition. Indeed, the prior art has implemented certain approaches in attempting to reduce this effect, where a particular approach depends on the extent to which the sidewall spacer is completed at the time the approach is taken. Specifically, in one approach, when only two layers of the sidewall spacer are in place, sometimes referred to in current technology as an "offset spacer" (meaning the entirety of all layers forming the spacing sidewall are not yet complete), the recess is formed and then an hydrofluoric (HF) acid wash is used at that point to remove impurities in the recess, followed by the epitaxial SiGe deposition. Note that the HF wash does not affect the sidewall spacer layers to a large extent at that point because typically the second sidewall spacer layer is nitride, which is resistant to the HF and, thus, protects the underlying layer between it and the transistor gate. Alternatively, in another approach, when the entire spacing sidewall is complete by adding more layers to it, the recess is formed and a remote plasma with a fluorine-based chemistry is used. While this latter approach is workable when the spacing sidewall is complete, it is noted in connection with the preferred embodiments, detailed below, that it is not preferable when cleaning the drain recesses at offset spacer layers due to the then-exposed nitride spacer layer, which cannot properly resist the fluorine plasma chemistry.

Thus, in view of the above, there arises a need to address the drawbacks of the prior art, as is achieved by the preferred embodiments described below.

BRIEF SUMMARY OF THE INVENTION

In the preferred embodiment, there is a method of forming an integrated circuit transistor. The method provides a first semiconductor region and forms a gate structure in a fixed position relative to the first semiconductor region. The gate structure has a first sidewall and a second sidewall. The method also forms at least a first layer adjacent the first sidewall and the second sidewall. The method also forms at least one recess in the first semiconductor region and extending laterally outward from the gate structure. Additional steps in the method are first, oxidizing the at least one recess such that an oxidized material is formed therein, second, stripping at least a portion of the oxidized material, and third, forming a second semiconductor region in the at least one recess.

Other aspects are also disclosed and claimed.

BRIEF DESCRIPTION OF THE SEVERAL VIEWS OF THE DRAWING

FIG. 2a illustrates a cross-sectional view of an integrated circuit semiconductor device 50 according to the preferred embodiments.

FIG. 2b illustrates a cross-sectional view of the integrated circuit semiconductor device 50 of FIG. 2a after additional processing steps.

DETAILED DESCRIPTION OF THE INVENTION

Figure 1A:
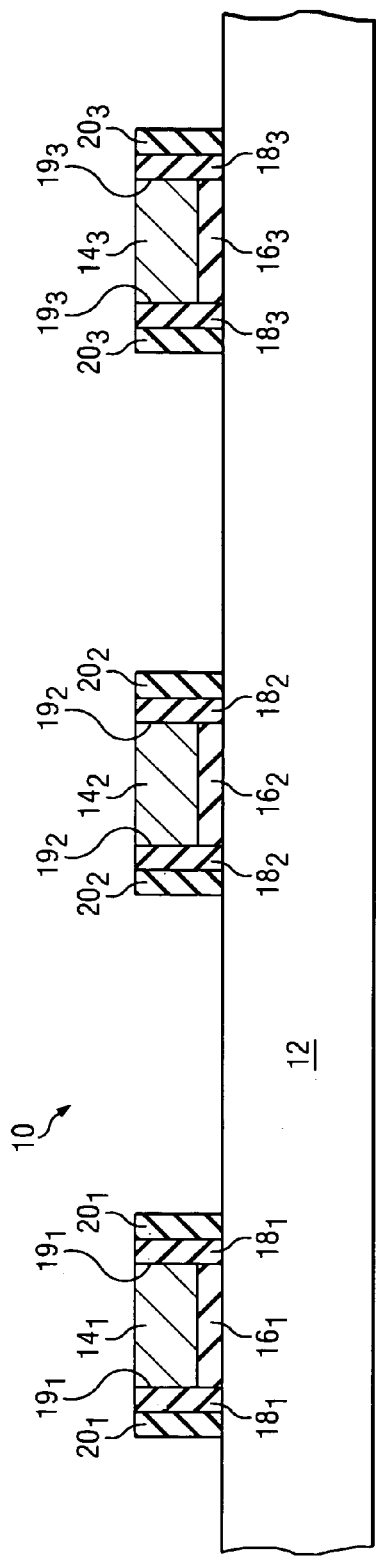
FIG. 1a illustrates a cross-sectional view of a prior art integrated circuit semiconductor device 10.

FIG. 1a illustrates a cross-sectional view of a prior art integrated circuit semiconductor device 10, where device 10 and the later discussion demonstrate in part the formation of recessed drain extensions according to the prior art. Device 10 is formed in connection with a silicon semiconductor substrate 12. Overlying substrate 12 are three gate conductors $14_1$, $14_2$, and $14_3$, where typically each gate conductor $14_x$ is formed at a same time and with a material such as polysilicon. Each gate conductor $14_x$ is separated from substrate 12 by a respective gate insulator $16_1$, $16_2$, and $16_3$, and the combination of conductor and respective gate insulator is sometimes referred to as a "gate stack." Along each sidewall $19_x$ of each gate conductor $14_x$ is formed a first sidewall layer $18_x$, typically formed of an oxide, where often that oxide is grown on the sidewall $19_x$ of the corresponding polysilicon gate structure. For example, with respect to gate $14_1$, it has a first sidewall layer $18_1$ formed adjacent its two sidewalls $19_1$. Additionally, a second sidewall spacer $20_x$, typically formed as a nitride, is formed along each first sidewall layer $18_x$. For example, with respect to gate $14_1$, it has a second sidewall spacer layer $20_1$ formed along each of the two first sidewall layers $18_1$. Typically the nitride is formed by depositing a nitride layer over device 10 and etching it to form the resulting layers $20_x$ shown in FIG. 1a. Note that the sidewall spacers $18_x$ and $20_x$ are sometimes referred to in the art as offset spacers, and they combine with additional later-formed spacers (not shown) to form in their entirety what is sometimes referred to generally as a "sidewall" or "spacing sidewall."

Figure 1B:
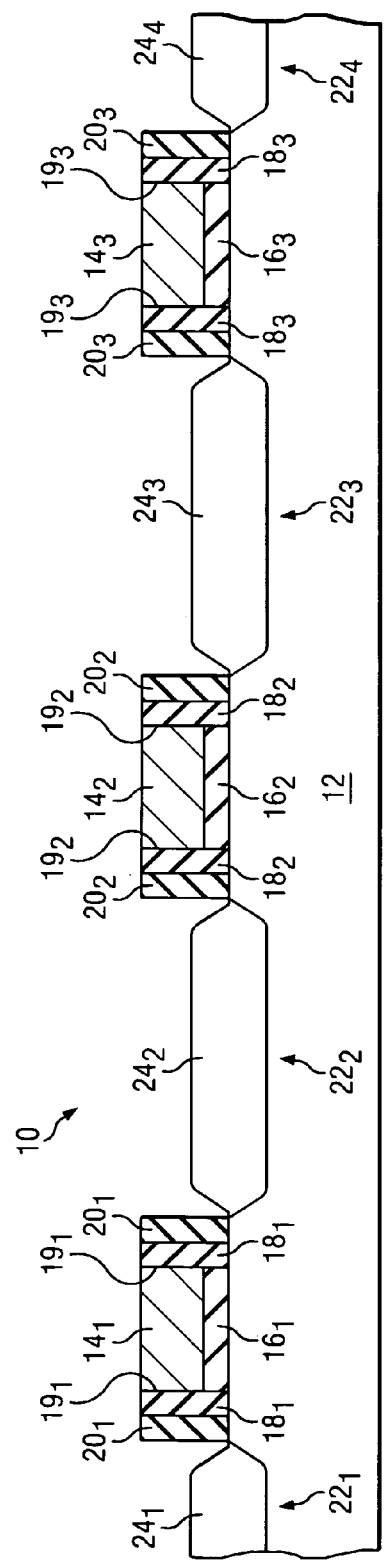
FIG. 1b illustrates a cross-sectional view of the prior art integrated circuit semiconductor device 10 of FIG. 1a after additional processing steps.

FIG. 1b illustrates a cross-sectional view of prior art semiconductor device 10 of FIG. 1a after additional processing steps. First, recesses $22_1$, $22_2$, $22_3$, and $22_4$ are formed adjacent and extending laterally outward from each combination of gate conductor/sidewall spacers that was formed in connection with FIG. 1a. The recess, as its name connotes, is a removal of some of the silicon that forms substrate 12, and in device 10 is between each successive gate structure. According to the prior art, after all recesses $22_x$ are created, a cleaning step is provided so as to prepare the upper surface of substrate 12 in these recesses, and the chemistry of this step is selected in view of the fact that nitride, in the form of sidewall spacer layer $20_x$, is presently the outermost layer protecting the sidewalls $19_x$ of each gate conductor $14_x$. Thus, according to the prior art, after all recesses $22_1$ through $22_4$ are created, an hydrofluoric (HF) acid wash is applied to device 10 and, thus, in each recess $22_x$. Next, an epitaxial SiGe deposition is performed to grow SiGe regions $24_1$ through $24_4$ in the respective areas of recesses $22_1$ through $22_4$; as depicted in FIG. 1b, each SiGe region tends to bow upward in its center. Further, the SiGe regions are in some technologies referred to as drain extensions, as they in effect extend the drain (or source) of each transistor beyond that of the conventional region (and/or dopants) located in the underlying substrate and laterally outward of the sidewalls $19_x$ of the corresponding transistor gate. In any event, with the formation of the SiGe regions, then as explained earlier in the Background Of the Invention section of this document, there is a mis-match in the lattice of that material and the adjacent silicon of substrate 12. As a result, this mis-match creates what is referred to in the art as a strain in the transistor channel, which is located underneath each gate $14_x$ and its respective insulator $16_x$, and the strain improves mobility and therefore transistor operation. Lastly, note that various additional processing steps typically are taken with respect to device 10 so as to create additional device aspects and also for other purposes such as interconnecting devices, but such steps are neither shown nor discussed so as to simplify the present discussion.

Figure 2C:
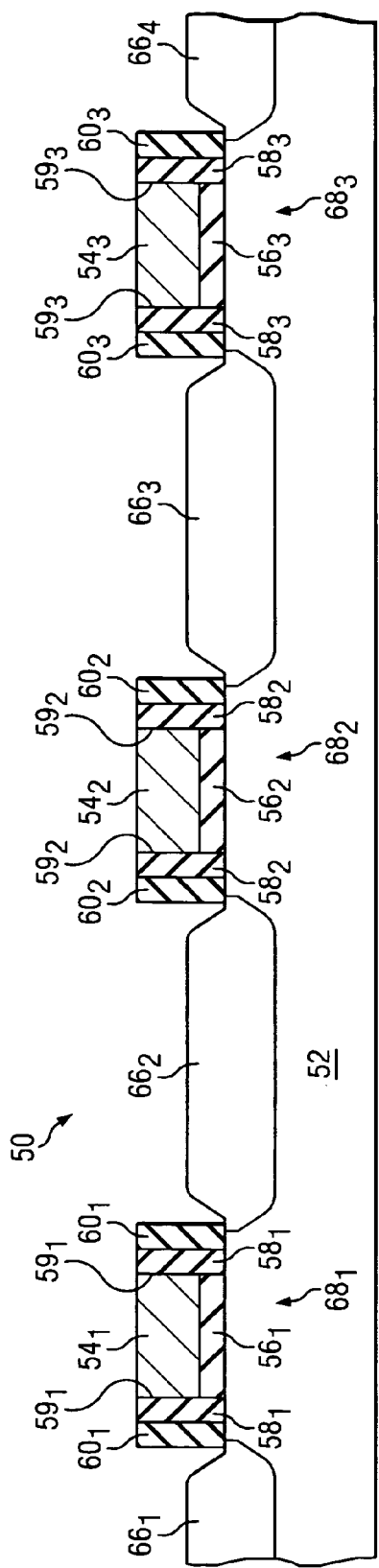
FIG. 2c illustrates a cross-sectional view of the integrated circuit semiconductor device 50 of FIG. 2b after additional processing steps.
Figure 3:
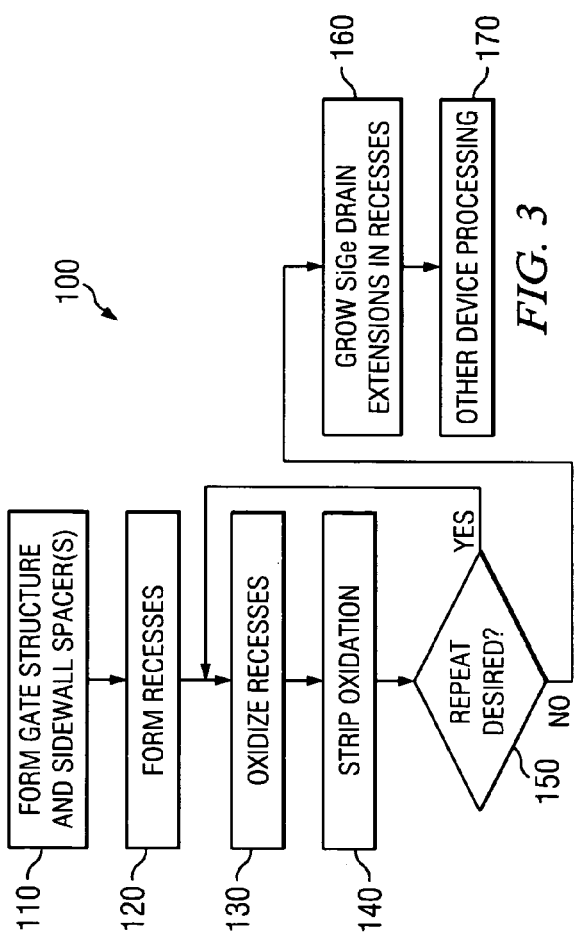
FIG. 3 illustrates a flow chart method 100 of forming the integrated circuit device of FIGS. 2a through 2c.

FIGS. 2a through 2c illustrate cross-sectional views representing various processing steps with respect to a semiconductor device 50 according to the preferred embodiments, and those Figures are now discussed with further reference to a flow chart method 100 in FIG. 3, which lists various of those processing steps. Before proceeding, note that FIGS. 2a through 2c and 3 are not intended to be exhaustive of all processing steps, but instead only certain steps are depicted so as to focus on particular aspects of the preferred embodiments. Looking to method 100 of FIG. 3, a first step 110 is performed, and it may occur in the same manner as the prior art such as was described in connection with FIG. 1a. Briefly re-visiting some of those details, gate structures and sidewall spacer layers are formed, in a fixed position relative to a device substrate (or a well or other region within a substrate). Thus, in FIG. 2a, device 50 is shown to include a silicon semiconductor substrate 52, and overlying substrate 52 are three gate conductors $54_1$, $54_2$, and $54_3$, preferably formed at a same time and with a material such as polysilicon. Each gate conductor $54_x$ is separated from substrate 52 by a respective gate insulator $56_1$, $56_2$, and $56_3$. Along each sidewall $59_x$ of each gate conductor $54_x$ is formed a first sidewall layer $58_x$, preferably formed of an oxide, where often that oxide may be grown on each adjacent sidewall $59_x$ of the corresponding polysilicon gate structure. Additionally, a second sidewall spacer $60_x$, preferably formed as a nitride, is formed along each first sidewall layer $58_x$. The nitride preferably is formed by depositing a nitride layer over device 50 and etching it to form the resulting layers $60_x$ shown in FIG. 2a. Continuing with FIG. 3, the flow of method 100 continues from step 110 to step 120, wherein recesses are formed in the semiconductor region in which the transistor source(s)/drain(s) are being formed, where in the example of FIG. 2a this region is substrate 52. Thus, FIG. 2a illustrates recesses $62_1$, $62_2$, $62_3$, and $62_4$, formed by removing some of the silicon that forms substrate 52 in the areas adjacent each combination of gate conductor/sidewall spacer. Recesses $62_1$ through $62_4$ may be formed using numerous techniques as ascertainable by one skilled in the art, and this process may be performed in an asher. With each recess $62_x$, a material may be formed therein in a subsequent step so as to be adjacent the transistor channel underlying each gate stack, as detailed later.

Continuing with FIG. 2a and FIG. 3, after step 120, method 100 continues to step 130. Here, however, unlike the prior art which proceeds with an immediate clean, in the preferred embodiment step 130 oxidizes recesses $62_1$ through $62_4$, which preferably is achieved by exposing device 50 to an oxidizing environment. In a preferred embodiment, such an environment may be achieved again using an asher, which is a form of equipment that is favorable in that its use is ubiquitous in semiconductor processing and, hence, it should be readily available for other processing steps in addition to step 130. Indeed, as mentioned above, such an asher may be used to perform step 120 to form recesses $62_1$ through $62_4$, in which case device 50 may remain in the same asher equipment to thereafter perform step 130 without moving integrated circuit 50 between different equipment to achieve these different steps. In any event, the oxidization of step 130 penetrates into the surface of recesses $62_1$ through $62_4$ to thereby remove any surface contaminants while also consuming embedded contamination or silicon damage in substrate 52, some or all of which may occur as a result of the recess etch of step 120. Toward this end, dashed lines are shown below each of recesses $62_1$ through $62_4$ in FIG. 2a to depict respective oxidized regions $64_1$ through $64_4$ that result from step 130. In a preferred embodiment, the depth of oxidized regions $64_1$ through $64_4$ is on the order of 15 to 20 Angstroms, although that depth may differ in different implementations. Indeed, preferably during the development of a specific set of processing steps consistent with method 100, the desired depth of these oxidized regions may be determined empirically by experimenting with different depths and measuring the performance of the resulting device once it is completed with other steps, where such performance might be the quality of the interface between each recess and the subsequent Si—Ge formed therein and as further appreciated below.

FIG. 2b illustrates a cross-sectional view of device 50 during a subsequent processing step, which in FIG. 3 is shown with respect to method 100 when it moves from step 130 to step 140. Particularly, in step 140, oxidized regions $64_1$ through $64_4$ are stripped from device 50. In one preferred embodiment, this strip is performed with a dilute hydrofluoric (HF) solution. In another preferred embodiment, the strip may be performed with a so-called standard clean 1 (SC-1) process, in which hydrogen peroxide and ammonium hydroxide and water are used as cleaning agents. While not drawn to scale, for sake of illustrating the effect, FIG. 2b demonstrates that the strip will consume silicon and remove silicon oxide, thereby causing the silicon recess to become slightly deeper. In any event, once a strip directed to oxidized regions $64_1$ through $64_4$ has been performed, method 100 continues from step 140 to step 150.

Step 150 represents a possibility of repeating the oxidization and stripping of steps 130 and 140, respectively, should such a repetition be desired. Thus, step 150 is shown as a query that is satisfied if it is perceived that more contaminant or damages remain in the recesses $62_1$ through $62_4$; in actual implementation, this query may be established as merely a counter or the like so as to cause a desired number of repetitions of steps 130 and 140, that is, as shown in FIG. 3, if step 150 is answered in the affirmative, then the flow returns to repeat step 130 and step 140 an additional time. Note that the need for, or number of times of, repetition may be based on the anticipated depth of the contaminants and damage caused by the recess-forming step 120, that is, if contaminants are perceived to be below a certain depth within substrate 52, then a better manner of addressing them may be in one embodiment to perform steps 130 and 140 a first time to remediate a first portion of those contaminants and then to repeat step 130 and step 140, one or more times, to remove a remaining portion of those contaminants. Of course, adding processing steps is often viewed with various burdens in semiconductor fabrication flows and, thus, the cost of such additional steps should be measured against the ability to sufficiently address the contaminants and/or damage in substrate 52 with a minimal number of steps. However, if the contaminants and/or damage extend beyond a depth threshold that may be ascertained by one skilled in the art, repeating step 130 and step 140 may be favorable as compared to the possible extra time required to move the integrated circuit from an asher to a different piece of equipment so as to effectively strip the contaminants and/or damage. In any event, at some point, step 150 should continue the flow to step 160 when no additional repetition is desired, such as when it is anticipated that there will be no or substantially little remaining contaminant or damage in substrate 52. Toward this end, note that this coincides with FIG. 2b, which illustrates that oxidized regions $64_1$ through $64_4$, from FIG. 2a, have been removed.

FIG. 2c illustrates a cross-sectional view of device 50 following a subsequent processing step, which in FIG. 3 is shown with respect to method 100 as it moves from step 150 to step 160. In step 160, Si—Ge regions $66_1$ through $66_4$ are formed in recesses $62_1$ through $62_4$, respectively. In the preferred embodiment, SiGe regions may be formed in the same manner as the prior art, that is, by an epitaxial SiGe deposition, and again the completed regions will tend to bow upward in each respective center. However, due to the improved steps described above, an improved interface exists between each SiGe region $66_x$ and the silicon of substrate 52 that is in contact with that region. With this improved interface there is an improvement in the SiGe deposition leading to strain created in the channel area, show as channel areas $68_1$, $68_2$, and $68_3$, below each respective gate insulator $56_1$, $56_2$, and $56_3$ and its associated gate conductor $54_1$, $54_2$, and $54_3$. Thus, device performance is improved.

Completing FIG. 2c, after the SiGe drain extension regions are formed in step 160, method 100 continues to step 170. Step 170 generally indicates that other device processing steps are taken, and those steps may be readily selected by one skilled in the art. For example, additional layers may be formed adjacent the sidewall spacer layers $58_x$ and $60_x$ so as to form complete sidewalls, doping may be performed, and connectivity between devices may be achieved. Eventually, therefore, for each gate conductor $54_x$ a working transistor is created, and the performance of that device will be improved, as compared to the prior art, due to the inventive teachings set forth above.

From the above, it may be appreciated that the preferred embodiments provide improved recessed drain extensions in a transistor device. Various alternative have been provided according to preferred embodiments, and still others may be ascertained by one skilled in the art. Indeed, certain of the process parameters described herein may be adjusted by one skilled in the art, steps may be added or re-arranged in order, and substitutions in some materials also may be made. Further, while the present embodiments have been described in detail, various substitutions, modifications or alterations could be made to the descriptions set forth above without departing from the inventive scope, as is defined by the following claims.

The invention claimed is:

1. A method of forming an integrated circuit transistor, comprising:
   providing a first semiconductor region;
   forming a gate structure in a fixed position relative to the first semiconductor region, the gate structure having a first sidewall and a second sidewall;
   forming at least a first layer adjacent the first sidewall and the second sidewall;
   forming at least one recess in the first semiconductor region and extending laterally outward from the gate structure;
   first, oxidizing the at least one recess such that an oxidized material is formed therein;
   second, stripping at least a portion of the oxidized material; and
   third, forming a second semiconductor region in the at least one recess.

2. The method of claim 1 wherein the step of forming at least one recess comprises:
   forming a first recess in the first semiconductor region and extending laterally outward from the gate structure in one direction; and
   forming a second recess in the first semiconductor region and extending laterally outward from the gate structure in another direction.

3. The method of claim 2 wherein the oxidizing step oxidizes the first and second recesses such that an oxidized material is formed in the first and second recesses.

4. The method of claim 3 wherein the stripping step strips at least a portion of the oxidized material in the first and second recesses.

5. The method of claim 4 wherein the step of forming a second semiconductor region in the at least one recess comprises:
forming the second semiconductor region in the first recess; and
forming a third semiconductor region in the second recess.

6. The method of claim 5:
wherein the first semiconductor region consists of silicon; and
wherein the second semiconductor region consists of silicon germanium.

7. The method of claim 5 and, prior to the steps of forming the second and third semiconductor regions, the steps of repeating the oxidizing and stripping steps at least one additional time.

8. The method of claim 5 wherein the step of forming at least on recess and wherein the oxidizing step are both performed in a same piece of equipment.

9. The method of claim 5 wherein the step of forming at least on recess and wherein the oxidizing step are both performed in a same piece of equipment without removing the integrated circuit device from the equipment between the step of forming at least on recess and the step of oxidizing.

10. The method of claim 5 wherein the stripping step comprises stripping with a chemistry selected from a group consisting of hydrofluoric acid and a standard clean 1 (SC-1) process.

11. The method of claim 5 wherein the step of oxidizing forms oxidized material on the order of 15 to 20 Angstroms in depth.

12. The method of claim 5 wherein the step of forming at least a first layer adjacent the first sidewall and the second sidewall comprises forming nitride.

13. The method of claim 5 wherein the step of forming at least a first layer adjacent the first sidewall and the second sidewall comprises:
forming a first layer adjacent the first sidewall and adjacent the second sidewall; and
forming a second layer adjacent the first layer.

14. The method of claim 13:
wherein the first layer comprises oxide; and
wherein the second layer comprises nitride.

15. The method of claim 1 wherein the step of forming a gate structure comprises:
forming a gate insulator adjacent the first semiconductor region; and
forming a polysilicon member adjacent the gate insulator and opposite of the first semiconductor region.

16. The method of claim 5 wherein the step of providing a first semiconductor region comprises providing a semiconductor substrate.

17. The method of claim 1:
wherein the first semiconductor region consists of silicon; and
wherein the second semiconductor region consists of silicon germanium.

18. The method of claim 1 and, prior to the steps of forming the second and third semiconductor regions, the steps of repeating the oxidizing and stripping steps at least one additional time.

19. The method of claim 1 wherein the step of forming at least on recess and wherein the oxidizing step are both performed in a same piece of equipment.

20. The method of claim 1 wherein the step of forming at least on recess and wherein the oxidizing step are both performed in a same piece of equipment without removing the integrated circuit device from the equipment between the step of forming at least on recess and the step of oxidizing.

21. The method of claim 1 wherein the stripping step comprises stripping with a chemistry selected from a group consisting of hydrofluoric acid and a standard clean 1 (SC-1) process.

22. The method of claim 1 wherein the step of forming at least a first layer adjacent the first sidewall and the second sidewall comprises forming nitride.

23. The method of claim 1 wherein the step of forming at least a first layer adjacent the first sidewall and the second sidewall comprises: forming a first layer adjacent the first sidewall and adjacent the second sidewall; and forming a second layer adjacent the first layer.

24. The method of claim 1:
wherein the first layer comprises oxide; and
wherein the second layer comprises nitride.

25. The method of claim 1:
wherein the gate structure comprises a first gate structure;
wherein the method forms a plurality of integrated circuit transistors;
wherein the step of forming a gate structure is further for forming a second gate structure in a fixed position relative to the first semiconductor region, the second gate structure having a first sidewall and a second sidewall;
wherein the step of forming at least a first layer is further for forming at least a first layer adjacent the first sidewall and the second sidewall of the second gate structure; and
wherein the step of forming at least one recess comprises forming the at least one recess in the first semiconductor region and extending laterally outward from the first gate structure and to the second gate structure.

* * * * *